US007003738B2

(12) United States Patent
Bhattacharya et al.

(10) Patent No.: US 7,003,738 B2
(45) Date of Patent: Feb. 21, 2006

(54) PROCESS FOR AUTOMATED GENERATION OF DESIGN-SPECIFIC COMPLEX FUNCTIONAL BLOCKS TO IMPROVE QUALITY OF SYNTHESIZED DIGITAL INTEGRATED CIRCUITS IN CMOS USING ALTERING PROCESS

(75) Inventors: Debashis Bhattacharya, Plano, TX (US); Vamsi Boppana, Santa Clara, CA (US); Rajeev Murgai, Santa Clara, CA (US); Rabindra Roy, Hillsboro, OR (US)

(73) Assignee: Zenasis Technologies, Inc., Campbell, CA (US)

( * ) Notice: Subject to any disclaimer, the term of this patent is extended or adjusted under 35 U.S.C. 154(b) by 383 days.

(21) Appl. No.: 09/896,071

(22) Filed: Jun. 29, 2001

(65) Prior Publication Data

US 2002/0053063 A1 May 2, 2002

Related U.S. Application Data

(60) Provisional application No. 60/215,523, filed on Jun. 30, 2000.

(51) Int. Cl.
*G06F 17/50* (2006.01)
(52) U.S. Cl. ............ 716/1; 716/2; 716/5; 716/11
(58) Field of Classification Search ............ 716/1, 716/4, 8, 9, 18, 2, 5, 11, 17
See application file for complete search history.

(56) References Cited

U.S. PATENT DOCUMENTS 5,555,201 A * 9/1996 Dangelo et al. ............ 716/1
5,617,328 A * 4/1997 Tsai et al. .................. 716/8
6,083,271 A * 7/2000 Morgan ..................... 716/1
6,163,877 A * 12/2000 Gupta ........................ 716/8
6,216,252 B1 * 4/2001 Dangelo et al. ............ 716/1
6,378,123 B1 * 4/2002 Dupenloup ............... 716/18
6,415,426 B1 * 7/2002 Chang et al. .............. 716/9

OTHER PUBLICATIONS

Kazuo Taki, "A Survey for Pass-Transistor Logic Technologies", IEEE, 1998.
Mineo Kaneko and Jialin Tian, "Concurrent Cell Generation and Mapping for CMOS Logic Circuits", IEEE, 1997.
C. P. Liu and J. A. Abraham, "Transistor Level synthesis for Static CMOS Combinational Circuits", Proc. 9th Great Lake Symposium on VLSI, pp. 172-175, 1999.
S. Gavrilov, A. Glebov, "*Library-Less Synthesis for Static CMOS Combinational Logic Circuits*", Research Institute for BLSI CAD Systems, Russian Academy of Science, IEEE 1997.
C. Yang and M. Ciesielski, "*Synthesis for Mixed CMOS/PTL Logic: Preliminary Results*", Department of Electrical and Compute Engineering, University of Massachusetts.

* cited by examiner

*Primary Examiner*—Thuan Do
(74) *Attorney, Agent, or Firm*—Ohlandt, Greeley, Ruggiero & Perle, L.L.P.

(57) ABSTRACT

The present invention pertains to an automated method for designing a integrated circuit (IC) design-specific cell, the method includes the steps of receiving a design specification for the design-specific cell, mapping a transistor-level representation of the design-specific cell, wherein the mapping is based on at least one, but perhaps plural design specifications, and evaluating the transistor-level representation of the design-specific cell for satisfaction of the design specification.

38 Claims, 7 Drawing Sheets

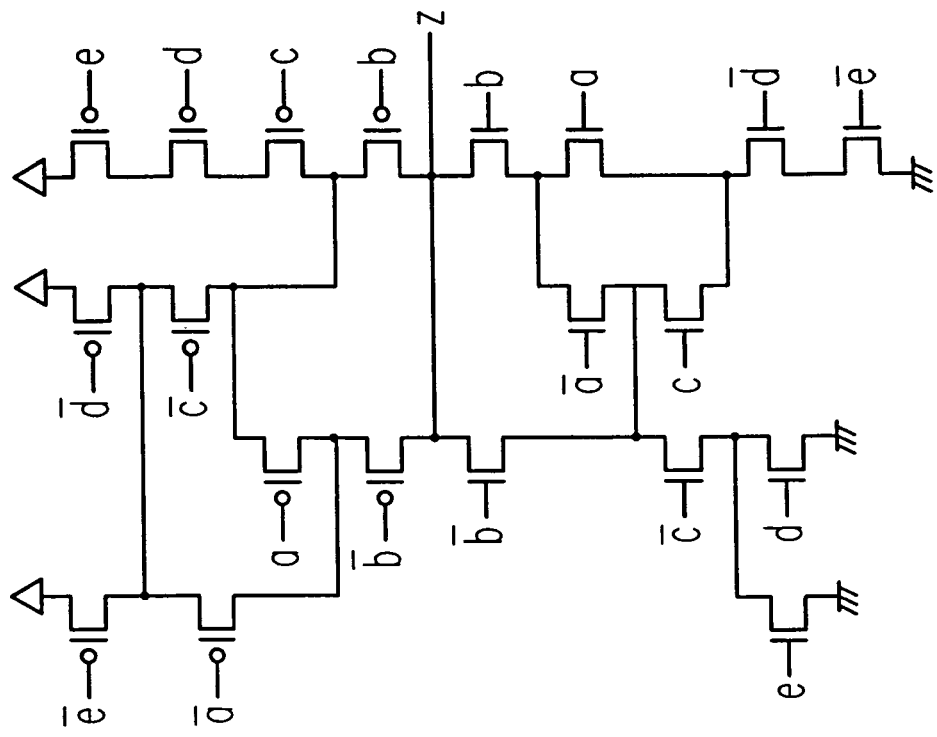
FIG. 5b
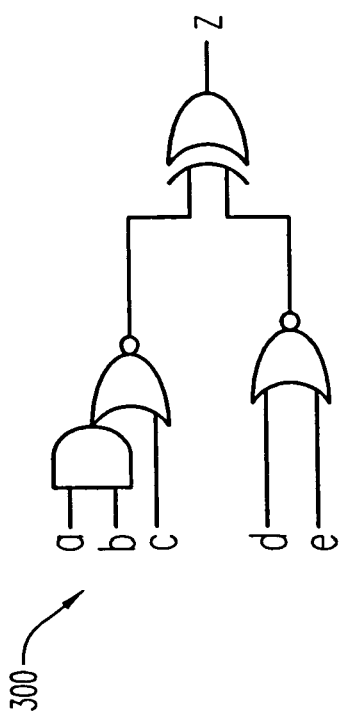
FIG. 5a
```
CRITICAL PATH TO z THROUGH b
⇨ DELAY FROM b TO z        : 0.33 ns
⇨ DESIGN-SPECIFIC CELL DELAY : 0.14 ns
```
FIG. 5c

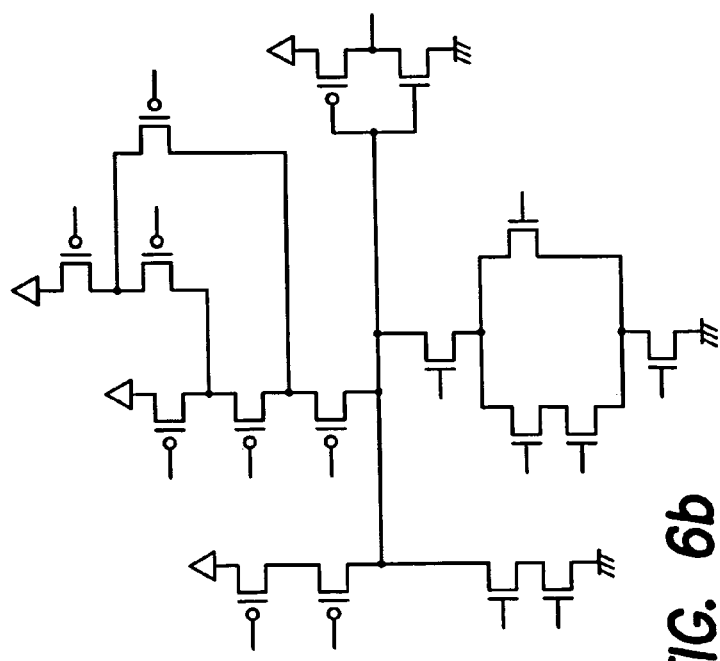
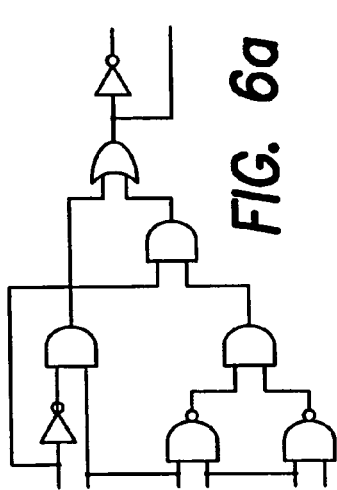
FIG. 6a
FIG. 6b
FIG. 6c

PROCESS FOR AUTOMATED GENERATION OF DESIGN-SPECIFIC COMPLEX FUNCTIONAL BLOCKS TO IMPROVE QUALITY OF SYNTHESIZED DIGITAL INTEGRATED CIRCUITS IN CMOS USING ALTERING PROCESS

This application is related to U.S. Provisional Patent Application No. 60/215,523, filed on Jun. 30, 2000.

BACKGROUND OF THE INVENTION

1. Field of the Invention

This invention relates to the design of integrated circuits (ICs) in general, and in particular to an automated system and process for creating highly optimized transistor-level building blocks that incorporate design-specific optimization goals and yields significant benefits for most design environments, such as, COT/COL, ASICS, ASP, etc.

2. Description of the Related Art

Over the last four decades, design and manufacturing of ICs has evolved into a multi-billion dollar industry. IC designs can be broadly classified into two major categories: (i) storage designs, which store digital data; and (ii) logic designs, which manipulate digital data.

The present invention described herein is applicable to the category of logic ICs or parts thereof, that deal broadly with data manipulation and several sub-categories thereof, viz., ASICs, ASSPs, COT/COL, etc.

The proliferation of digital ICs and the diversity of applications using ICs have led to the development and use of various types of metrics for evaluating the cost and quality of developed ICs. Die size, performance (i.e., speed), and power consumption have evolved as three of the most commonly used metrics for measuring the quality of IC designs. Other metrics, such as, for example, noise, signal integrity, reliability, etc. are gaining in importance. Time-to-market or design cycle time, and expected sales volume have evolved as two other commonly used business metrics. It is generally observed that the time-to-market period is steadily decreasing for nearly all digital ICs.

The importance of quality metrics, such as those mentioned above, is generally application-dependent, and thus varies from one design to another. Two of the most commonly used combinations of metrics are: (i) performance and power, and (ii) die size and power.

Due to ever-increasing time-to-market pressures, highly automated IC design processes have been developed that can be broadly categorized as: (i) fully pre-fabricated, highly programmable component-based design process (e.g., FPGA, etc.); (ii) partially pre-fabricated platform (e.g., gate array) based design processes, which, upon completion, require only that the metal layers be fabricated, and (iii) design processes that do not rely on any pre-fabricated components or platforms, but instead, use fixed building blocks (standard cells) with pre-defined schematic structure and layout, and fully customizable interconnections between the blocks wherein at the completion of the design process, all components (layers) in the design need to be fabricated from scratch. Among these, the last category of IC designs typically offers the highest performance, the smallest die size, and the lowest power among designs created using automated tools. In order to limit the complexity of the design process to manageable levels, traditionally, standard cell libraries are used in such automated design flows. Numerous automated IC design tools, e.g., simulation, synthesis, place-and-route, extraction, verification, etc., suitable for utilizing and/or use with standard cell libraries, have been developed. The synthesis tools accept as input a given design description in some suitable format (e.g., register-transfer level (RTL), behavioral, etc.), and generate a netlist. The netlist is simply an interconnection of the pre-defined cells in the standard-cell library. Place-and-route tools create a layout utilizing the layouts of the pre-defined standard cells such that the interconnections between the cells, as specified in the netlist, are preserved. Place-and-route tools also take into account the detailed timing issues that arise from the actual location of the various cells in the layout. A typical flow diagram of a process for creating IC designs using such standard-cell libraries is shown in FIG. 1.

A key problem with the existing approach of automated IC design processes is that designers, using synthesis tools, are forced to use components from a static, pre-defined standard-cell library of cells developed to be applicable to a wide variety of digital ICs. As a result, the cells tend to be relatively small and general-purpose. Standard-cells, such as basic Boolean gates: AND, OR, NAND, NOR, XOR, XNOR, AND-OR-INVERT, OR-AND-INVERT, MUX, etc. However, for a given design, the forced use of such pre-defined standard cells leads to poor quality in the final design as compared to full-custom (hand-crafted) IC design processes and judged by the aforementioned quality metrics. Particular attention has been drawn to this fact by recent comparisons of designs created by automated flows versus designs created using a full-custom, heavily manual design process.

Therefore, although automated tools and flows speed up the design creation process, the relatively poor quality of resultant designs as judged against the quality that can be achieved with a manual re-design of the same part, has major cost and business implications. Increased die-size and increased power consumption by as much a factor of 10 or more are two major and obvious such implications. Reduced performance of the automated design, by as much as a factor of 2, also has significant implications in the marketplace. Even a cursory comparison of handcrafted designs to automatically generated design shows a noticeable difference in the usage patterns of various layers in the physical design. Handcrafted designs tend to use all the layers, including diffusion and polysilicon layers, very effectively and efficiently, while automatically generated designs tend to use diffusion and polysilicon layers relatively sparsely while using the metal layers profusely. Recently, it has been noted by many designers and researchers that this profusion of metal interconnects in automatically generated designs constitutes an increasing problem (and bottleneck) in terms of performance and power consumption, as IC designs into deep-sub-micron geometries approaching 0.10 micron or less.

Prior attempts at improving the quality of automatically generated designs, over the past two decades, have focused primarily on automatic layout synthesis. A key constraint faced by automatic layout synthesis methods is that they are primarily appropriate for layouts of relatively small transistor-level designs. Attempts to apply the same automatic layout synthesis methods to the creation of VLSI designs—popularly known as silicon compilation in the early 1980's was pursued without such success for many years, and was eventually dropped.

More recently, a body of work has been reported in the area of automated creation of transistor-level designs. These efforts are primarily academic in nature, with a heavy focus on the use of pass-transistor logic (PTL). The vast majority of industrial standard-cell based designs continue to use static CMOS style of design, due to various problems inherent in PTL. Key among such problems is the loss of one $V\_t$ (threshold voltage of a transistor, modified by appropriate body effects) while passing a signal (high or low voltage) through pass transistors, which can easily lead to slow/improper functioning of subsequent stages of transistors driven by a pass transistor. A relatively smaller portion of the efforts that apply to static CMOS module generation are focused on simply minimizing transistor count in the transistor-level modules created. The prior automated IC design processes do not take into account performance of the resultant modules as well as a host of real-life constraints that must be taken into account while creating transistor-level modules used in actual designs. Such real-life constraints include (i) tolerable delays from individual inputs to output(s) of modules created at the transistor level, (ii) maximum depth of n- and p-transistor stacks in the modules created, (iii) tolerances on transition times of the signals at the outputs of modules created, (iv) desired drive-strength of resultant module, (v) limits on capacitive loads at inputs of the module created, etc.

SUMMARY OF INVENTION

In light of the shortcomings of automated IC design processes discussed above, the present invention focuses on the automated creation of functional IC design building blocks (i.e., cells) using a plurality of transistor level optimization techniques. Consequently, the present invention enriches the original library with new cells that are particularly suitable for specific IC designs. The present invention can take into account a plurality of constraints that may apply to cells in the implementation of the IC design. The design-specific cells designed in accordance with the present teachings tend to be larger than standard IC design cells made of pre-defined (i.e., standard) cells. The size of the present invention's cells can be optimized by IC design criteria so that (i) performance of the resultant cells is within acceptable limits, and (ii) the generated cells can be interfaced using existing automated layout synthesis tools. While the present invention is primarily focused on generation of cells in the CMOS designs, it should be appreciated by those skilled in the art that this invention can also used for creating cells for use in other types of IC designs, including various forms of "dynamic CMOS" and/or a combination of static CMOS and dynamic CMOS.

The present invention pertains to an automated method for designing an integrated circuit (IC) design-specific cell. The method includes the steps of receiving a design specification for the design-specific cell, mapping a transistor-level representation of the design-specific cell, wherein the mapping is based on at least one, but perhaps plural design specifications, and evaluating the transistor-level representation of the design-specific cells for satisfaction of the design specification.

BRIEF DESCRIPTION OF THE DRAWINGS

FIGS. 5a, 5b, 5c are exemplary depictions of an implementation of the present invention employing, wherein a cluster of standard cells in a portion of a design is replaced by design-specific cells to provide improved timing in that portion of the design;

FIGS. 6a, 6b, and 6c are exemplary depictions of an implementation of the present invention, wherein a cluster of standard cells in a portion of a design is replaced by a design-specific cell to minimize transistor count (and thereby reduce power, and area) for the portion of the design.

DETAILED DESCRIPTION OF THE INVENTION

Figure 1:
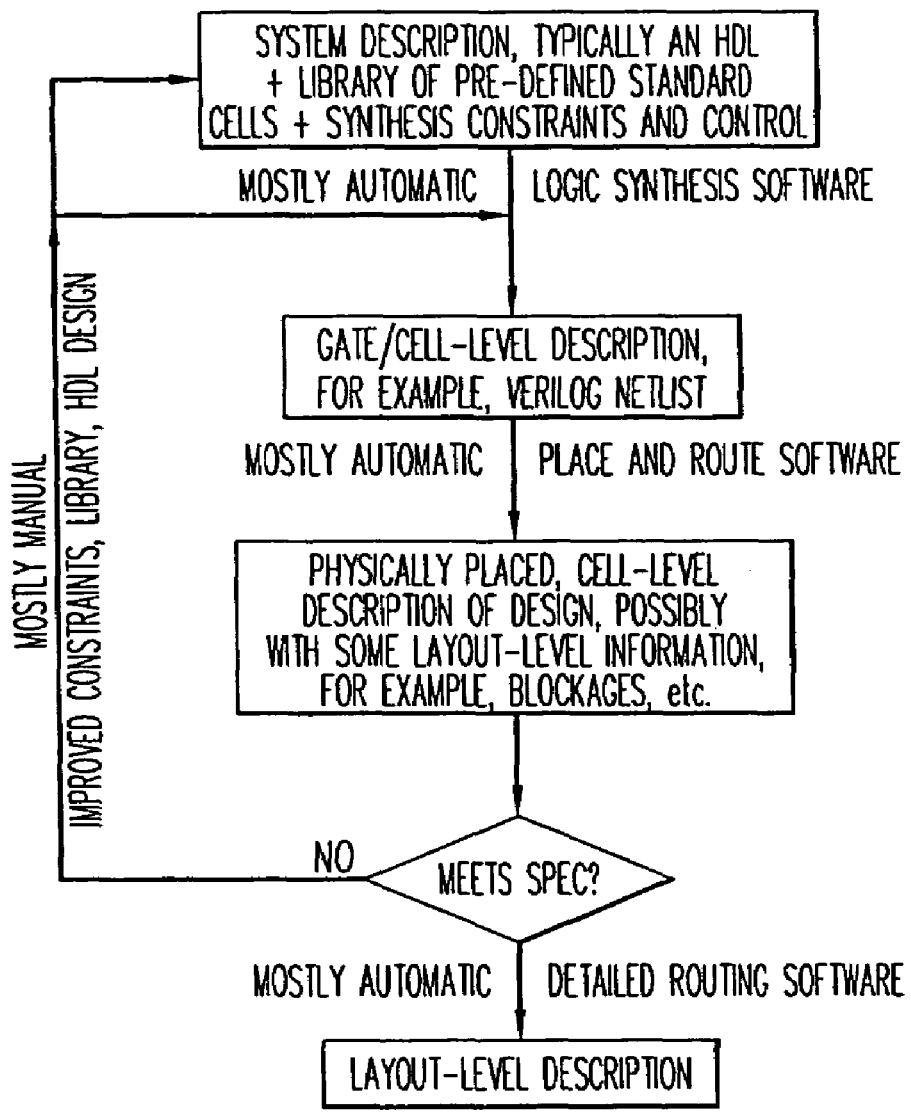
FIG. 1 is a block diagram of a conventional IC design process for standard-cell based design of digital logic circuits.

The present invention is a fully automated process capable of creation and optimization of design-specific, complex functional blocks, hereinafter designated design-specific cells. The use of design-specific cells in an automated IC design process has a very significant impact on the quality of the resultant design. The process of the present invention, in one aspect thereof, bridges the gap between designs created automatically and handcrafted designs. A fuller understanding of the overall organization of an IC design process using design-specific cells created in accordance with the present invention for designing high-quality, design-specific ICs can be had by referring to FIG. 2. The process of generating the design-specific IC design building blocks is represented as design-specific cell generation process 45.

In clustering process 40, prior to the invocation of the creation of the design-specific cell(s), the functionality of each target design-specific cell is identified from the description of the target IC design received from the graphical user interface (GUI) 75. While user interface 75 is preferably graphical in nature, this is not a requirement of these teachings. Performance, area, and other performance and/or design constraints for the target IC are considered and used to partition the target IC design into functional "clusters" using clustering process 40.

The clustering process 40, and the master optimization control 35 include analysis of the library of standard-cells, to detect weaknesses of the library in the context of the IC design being implemented. Such detection may involve, but is not limited to, the following steps: (i) studying the usage of library elements in the target design; (ii) identifying cells that are used extensively in the design (particularly in regions of criticality for optimization objectives for the design), and yet, lack efficient implementations of complemented functionality; (iii) identifying cells with a large number of stages in the transistor-level implementations, wherein a stage is usually identified by a drain of an MOS transistor being connected to the gate of another MOS; (iv) identifying cells in regions of criticality of the target design, with large propagation delay; (v) identifying cells in the regions of criticality of the target design, with larger transition delay; (vi) identifying cells in the regions of criticality of the target design, that lack balance between n- and p-transistor structures; (vii) identifying abnormal usage patterns of drive strengths for cells implementing same functionality (e.g., if one drive strength for a NAND cell is used hundreds of times, and another drive strength is used less than 10 times. Subsequent to detection of such weaknesses in the library, the process of the present invention is used to create design-specific cells that eliminate the problems detected, and thereby enrich the library for the specific design being targeted.

The functional clusters in an IC design, partitioned based on the constraints of the specific IC design, are used by design-specific cell generation process 45. Accordingly, the design-specific cells generated by design-specific cell generation process 45 are specifically designed for the subject IC design. In this manner, a highly customized IC design can be implemented using design-specific cells as shown in the automated IC design process of FIG. 2.

Figure 2:
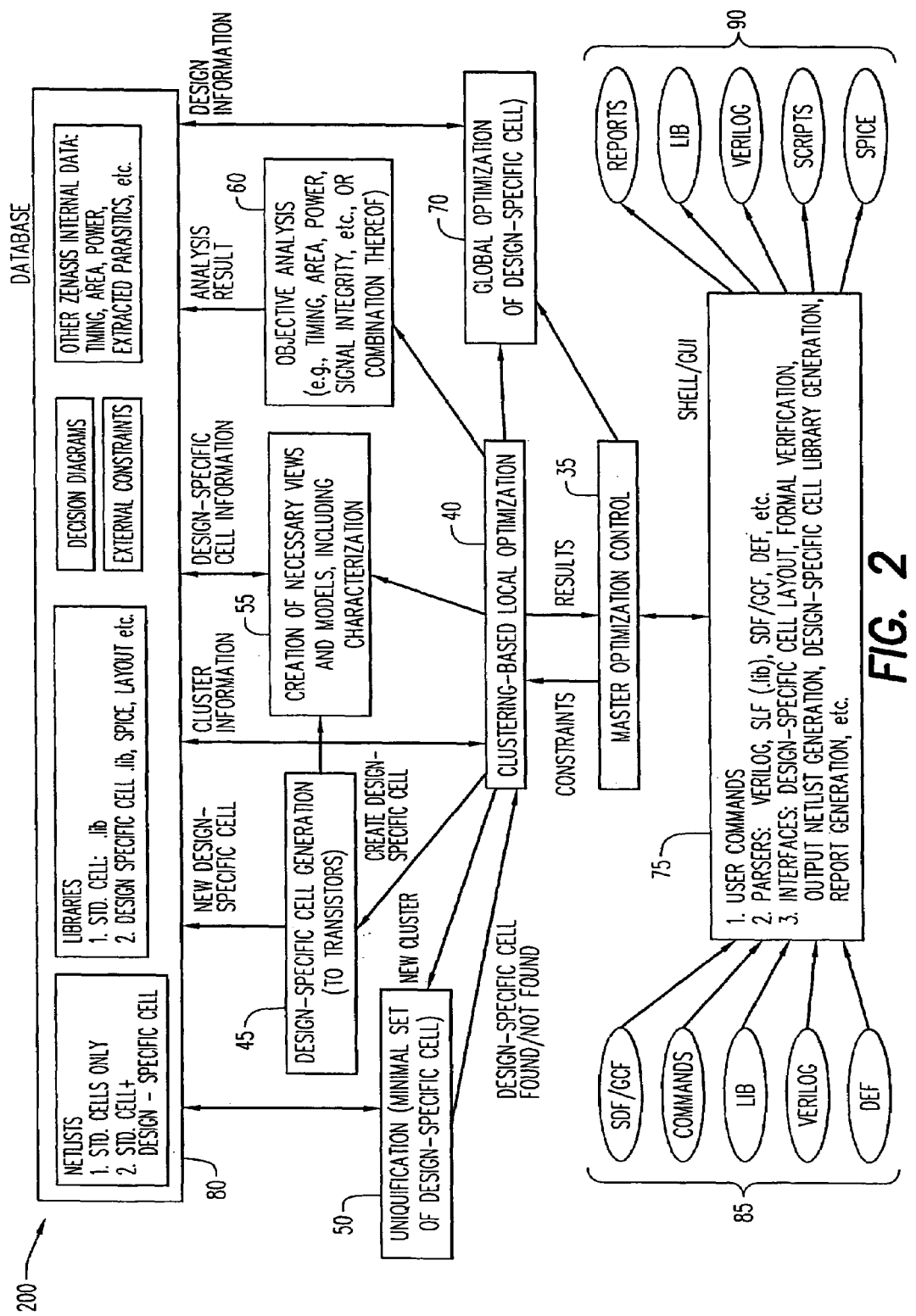
FIG. 2 is a flow diagram depicting a process automatically designing digital logic circuits, utilizing dynamically created, design-specific cells in accordance with the present invention.

In one aspect of the present invention, the process is aimed at bridging the gap in quality between IC designs created using automated tools and custom, handcrafted IC designs. As FIG. 2 illustrates, and as disclosed in detail in commonly assigned U.S. Patent Application entitled Method For Automated Design of Integrated Circuits With Targeted Quality Objectives Using Dynamically Generated Building Blocks, incorporated herein by reference in its entirety.

Clustering process 40 performs a detailed analysis of the IC design to be created (i.e., the target design), and identifies target cell-level clusters (partitions of interconnected cells) that will be represented by optimized design-specific cells. The functional "clusters" identified by clustering process 40 invokes design-specific cell generation process 45. The context in which each generated design-specific cell will be used is analyzed in clustering process 40 for the purpose of determining a set of performance and area constraints that will be used in generating the design-specific cells by design-specific cell generation process 45.

It is noted that clustering process 40 can invoke a uniquification and compaction process 50. Uniquification and compaction process 50 operates to minimize the number of functionally unique design-specific cells generated for use in the implementation of the IC design. Further, if a pre-defined standard-cell library is available (e.g., as one of the inputs 85 to the user interface 75), uniquification step 50 can be employed to identify near or exact matches (depending on the tolerance of the IC or design-specific cell design process). Design-specific cells having equivalent matches in the available standard-cell library can thus be replaced by standard-cells. Also, the number of distinct cells used is minimized.

Figure 3:
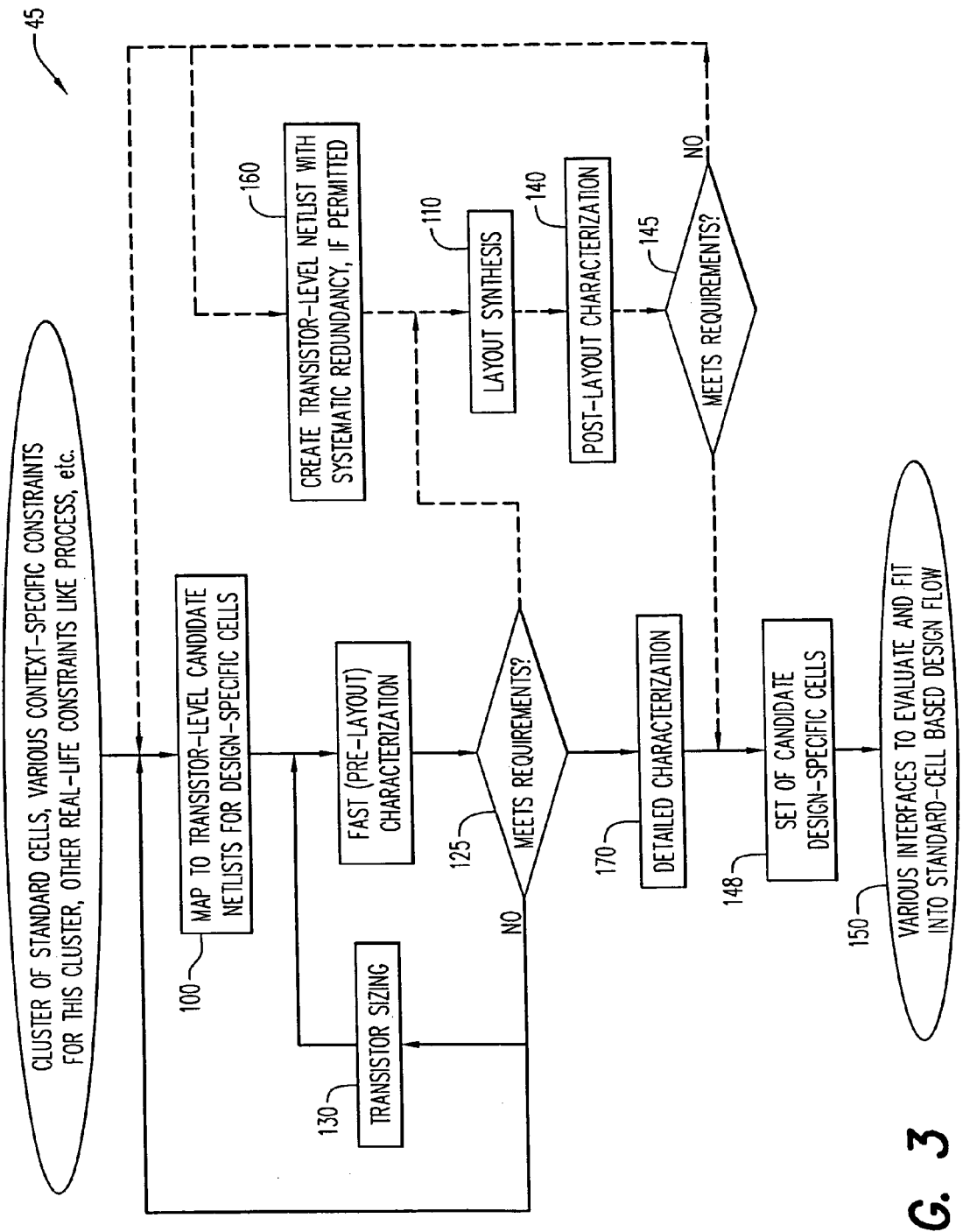
FIG. 3 is an exemplary flow diagram depicting an automated IC design process for generating design-specific cells, in accordance with the present invention.

A typical embodiment of the overall process of the present invention is depicted in FIG. 3. The IC design-specific cell generation process starts with mapping step 100 that creates transistor-level design representations of the set of design-specific cells identified and partitioned in step 40 of FIG. 2. Mapping step 100 provides the capability for: (i) ensuring functional correctness of the resultant transistor-level design; (ii) meeting design targets, for example, performance (e.g., speed), area, power dissipation, etc. for the design-specific cells generated for implementation in the IC design, in context of the intended implementation of the design-specific cell; (iii) meeting other implementation constraints, such as, but not limited to, maximum length of interconnects of through the N- or P-transistors forming in the design-specific cell, the required signal output (i.e., drive strength) for the design-specific cell, desired input capacitive load of the design-specific cell, etc.; (iv) minimizing the number of transistors in the design-specific cells, subject to the design of the IC design; (v) sizing the transistors of the transistor-level netlists for the design-specific cells, as necessary; and (iv) introducing systematic redundancy at the transistor-level, if necessary, to meet the design target(s) such as, for example, timing, power, etc. for the design-specific cells.

Optionally, layout synthesis step 110 is used to obtain layouts for the created transistor-level design-specific cells. Though not explicitly shown, sizing optimization of the transistors is preferably employed in layout synthesis step 110, if appropriate. An objective for layout synthesis step 110 is compatibility with a standard-cell library blocks such that the design-specific cells created can be interfaced with standard-cells. The compatibility of the design-specific cells and the standard-cells enables the final IC design to be highly customized (i.e., design-specific cells) and yet flexible enough to use standard-cells where possible and/or desired.

Fast characterization step 120 is performed to obtain an estimate of the timing characteristics of the design-specific cell since the design constraints are known and have in fact been used as the basis for generating the design-specific cells. Mapping step 100, optional layout synthesis step 110, and fast characterization step 120 are repeated, as necessary, to meet target design criteria, such as for example, the design-specific cell's timing, area and power constraints for each design-specific cell.

While FIG. 3 depicts an exemplary iterative embodiment a method for generating a design-specific cell in accordance with the present invention, other variations of the process can be devised to suit specific design optimization goals without departing from the scope of these teachings. Such variations include, but are not limited to, techniques such as simulated annealing, genetic algorithms, etc. to avoid being stuck in "local optima" during the transistor-level design generation and optimization process 45.

Also, a branch-and-bound search process can be used to avoid the local optima. Branch-and-bound search optimization involves (i) exploring alternative choices, to determine which choice is better, since such determination cannot be made a priori (i.e., branching), and (ii) ruling out some possible choices as being "obviously bad" (i.e., bounding). Design-specific cell generation process 45 preferably concludes with a detailed characterization step 170 once the generated design-specific cells meet the design specifications in step 125. At detailed characterization step 170, the design-specific cell generation process 45 is capable of characterizing the generated design-specific cells using highly accurate transistor-level simulation tools, such as SPICE, to obtain precise signal propagation and timing information about the cells. This is possible since the design-specific cells have preferably been generated using practical, implementation dependant design constraints in the generation and optimization of the design-specific cells.

The set of design-specific cells generated by design-specific cell generation process 45 is provided as an output at step 148, available for use, for example in an automated IC design process, such as the exemplary IC design process 200 of FIG. 2. The set of design-specific cells provided at step 148 is preferably coupled to interface 150. Interface 150 may be a plurality of interfaces for coupling the generated design-specific cells to the IC design process 200 preferably for the evaluation of the design-specific cells.

As previously mentioned, the design-specific cells are preferably formatted to be compatible with libraries of standard-cell IC blocks. Thus, the generated design-specific cells available at step 148 via interface 150, can preferably be interfaced together with an IC design process standard-cell library. The capability to combine design-specific cells generated in accordance with these teachings, and standard-cell IC building blocks enhances the ability of the automated IC design process to meet the design-specific criteria of the IC being designed thereby. The set of design-specific cells, either alone or in combination with standard-cells, provides an optimally tuned set of building blocks for the target IC design. The optimality is preferably measured against accepted and definable (i.e., quantifiable) metrics, such as but not limited to, die size, power consumption, noise, signal integrity, testability, etc.

In contrast to the design-specific cells disclosed herein, conventional standard-cell libraries consist of a collection of relatively low-complexity blocks presumably designed for wide application in a variety of designs. Therefore, standard-cell libraries are not functionally optimized on a per building block (i.e., cell) level for any specific IC design. Moreover, cells in a conventional standard-cell library are fixed. That is, conventional standard-cells, in contradistinction to the teachings herein, cannot be modified to adapt to the specific implementation context of the IC design for which they are used.

Process 45 of the present invention controls the functionality of the design-specific cells created therein, by incorporating the constraints and conditions of the IC design into the generation of the design-specific cells. Consequently, the quality of the target IC design achieved by the present invention, as measured in terms of the afore-mentioned metrics such as die size, performance, power consumption, signal integrity, etc., is significantly improved as compared to previous automated IC design processes.

With reference to FIGS. 2 and 3, it is noted that inputs to transistor mapping process 100 may be, (i) a set of structural cell-level netlists, and (ii) a set of performance and area constraints for each individual netlist provided to the IC design process 200 as part of inputs 85 entered into user interface 75. As mentioned above, the set of cell-level netlists, and the set of IC design constraints are identified and functionally associated with a functional "cluster" in clustering process 40 (see FIG. 2). The set of cell-level netlists can be obtained either by partitioning the output of a conventional logic synthesis tool, or deduced from a higher-level description language (e.g., RTL or behavioral) representation of the target IC design circuit.

The important steps of design-specific cell generation process 45 include: (i) mapping to transistors step 100; (ii) fast characterization step 120 (pre-layout) that incorporates implementation context of the design-specific cells; (iii) transistor sizing step 130; (iv) accurate characterization step 170; (v) the optional layout synthesis with transistor sizing, via an (optional) interface with an independent layout synthesis tool step 110; (vi) post-layout characterization step 140 if layout synthesis step 110 is performed; (vii) generation of interface(s) 150 to interface the design-specific cells into a standard-cell based design flow.

Optionally, and depending on the IC design being implemented, a systematic transistor-level redundancy exploration and insertion process 160 is invoked if certain design objective requirements (see steps 125 and 145), for a design-specific cell, such as signal timing, cannot be met by mapping to transistors step 100 and transistor sizing step 130 alone.

Design-specific cell generation process 45 may take in as an input a netlist composed of Boolean gates, or more generally, cells in a traditional standard cell library. The output of the generation process 45 is a netlist composed of transistors that implements the same function as the original cell-level netlist. The output netlist of generation process 45 may have, (i) a different interconnection topology for the transistors, (ii) different number of transistors (typically fewer), and (iii) different sizing of the transistors, as compared to the topology, transistor numbers and sizing of the gates or cells in the netlist provided at the input of design-specific cell generation process 45.

Figure 4:
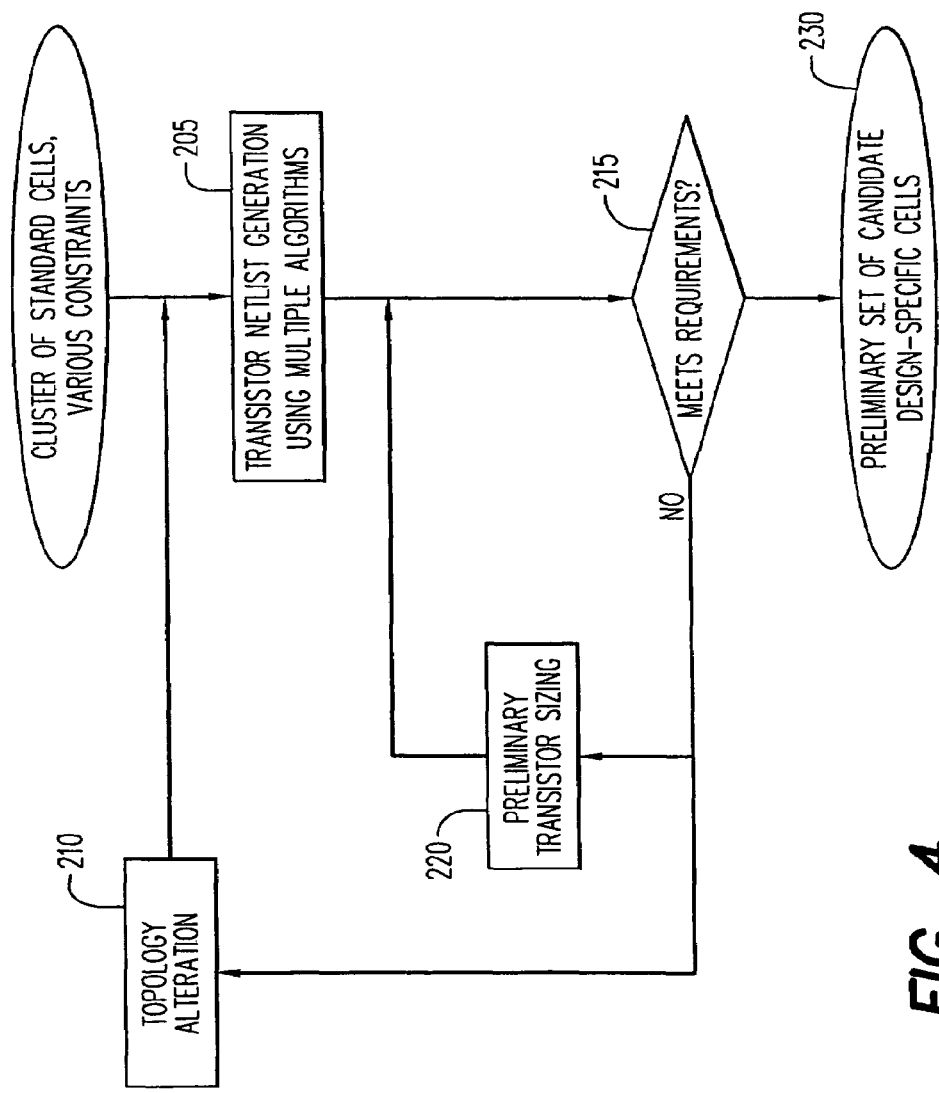
FIG. 4 is a flow diagram depicting details of the mapping to a transistor-level, in accordance with the present invention.

Mapping process 100 is depicted in greater detail in FIG. 4. The process of mapping out the interconnection of transistors for the design-specific cell generated in generation process 45 includes four major sub-steps as shown. In particular, the steps of mapping process 100 include, (i) transistor netlist generation step 200, (ii) evaluation step 215; (iii) transistor topology alteration step 210, and (iv) preliminary transistor sizing step 220. Known algorithms and heuristics may be can be used in the sub-steps of mapping process 100. For example, transistor netlist generation process 200 and transistor topology alteration process 210 could use various known transistor netlist generation techniques based on the use of Binary Decision Diagrams (BDD's).

A BDD is a well-known data structure based on acyclic directed graphs used to represent functions commonly encountered in digital circuits. Recent research has demonstrated techniques to derive transistor netlist structures using BDD's. There are a variety of BDD's. Free BDD's (FBDD's) are a variety of BDD's in which different paths traced through the structure can have input variables appearing in different orders. Another variety of BDD referred to as ordered BDD (OBDD), imposes a rule that variables encountered during tracing any path through the structure will always follow a fixed order. ROBDD is a special case of OBDD's, where there is exactly one (unique) ROBDD for each unique function (i.e., ROBDD's are canonical).

However, existing mapping algorithms suffer from the key limitation that they are geared towards working with very simple objectives, such as minimizing transistor count. Moreover, existing methods suffer from very high computational complexity. In accordance with the present invention, the optimization criteria and design requirements for the generated design-specific cell is not static (i.e., change per IC design) but is varied and complex due to the fact that the specification criteria may be inter-related in the practical, implementation situations considered by the present invention.

Consequently, new design processes have been developed in accordance with the present teachings to provide for the generation of highly efficient transistor-level implementations of design-specific cells, given clusters including interconnection of standard-cells, Boolean gates, or simply a Boolean function description of the cluster output(s). A flow diagram depicting the design-specific cell mapping process 100 for generating a design-specific cell(s) given a cluster input is provided in FIG. 4. The output may have one or more outputs depending on the function mapped via mapping process 100. Mapping process 100 preferably incorporates the strengths of BDD-based transistor netlist generation techniques, while minimizing the computation complexity, and allowing for enforcement of important real-world constraints.

Transistor netlist generation process 205 preferably starts with the invocation of a plurality of algorithms to generate the design-specific cells that may ultimately be used in the IC design. The algorithms used produce the netlists may include a path-based transistor network synthesis algorithm in which paths leading to terminal nodes 0(low) and 1(high), in the ROBDD representation of the functionality of the given cluster, are used to deduce the NMOS and PMOS networks that define a static CMOS implementation of the given cluster's functionality. The netlist may be generated using a transistor network synthesis algorithm that constructs the transistor netlist in a bottom-up manner, by traversing the ROBDD representation of the given cluster. The netlist may be generated employing a transistor network synthesis algorithm that uses Free BDDs" (FBDDs) instead of ROBDDs, whereby different root-to-terminal paths in FBDDs can have input variables appearing in different orders. This relaxation enables FBDDs to have potentially much smaller sizes than ROBDDs, thus resulting in much more compact transistor implementations of the design-specific cell.

The netlist may also be generated using a transistor network synthesis algorithm that employs "If-then-else (ITE) diagrams" that are a generalization of the FBDDs, in that the branching at a vertex can be done not only on an input variable of the function (which is the case for ROBDDs and FBDDs), but also on arbitrary sub-functions. Consequently, transistor networks generated using ITE diagrams may be even more compact than those generated using FBDDs. Such networks can also be optimized for performance targets easily, by incorporating the proper decomposition directly into the ITE diagram. Another possible method of possibly generating the netlists is to use a transistor network synthesis algorithm that uses gate-level logic optimization techniques, such as SIS, (the Sequential Interactive Synthesis program for designing digital circuits, developed at University of California, Berkeley) to generate efficient transistor networks for certain types of functions. Namely, functions having a with small sum-of-products (SOP) or factored form representation. Gate-level logic optimization techniques are particularly suited for operating with small SOP or factored form representations since neither are efficiently represented by any of the other above methods.

The topology alteration process 210 that is invoked if the netlist generation process of step 205 does not result in a netlist meeting the requirements of the IC design (step 215), explores multiple alternative topology implementations of the functionality of a given cluster. For example topology alteration process 210 may include using a variable reordering in the decision diagram (ROBDD, FBDD, or ITE) representations of the cluster. Topology alteration process 210 may also use multiple decomposition methods for the function such as, but not limited to, Boole-Shannon, Kronecker, Roth-Karp, Positive Davio, Negative Davio, and Ashenhurst techniques.

Topology alteration process 210 computes various metrics for each resultant design for each of the alternative topologies considered, and preferably stores the computed metrics in a database. The stored metric data is preferably used by the systematic transistor-level redundancy exploration process 160 (see FIG. 3), if invoked as part of the design-specific cell generation process 45.

The systematic transistor-level redundancy exploration and insertion process 160 of design-specific cell generation process 45 is invoked when a design-specific cell obtained by mapping to transistors (step 100), followed by transistor sizing (step 130) fails to produce a design-specific cell that meets the design objectives evaluated at step 125. The design requirements of step 125 may include, for example, propagation delays for transitions from a designated subset of inputs of the design-specific cell to its output (for single-output design-specific cell).

Redundancy exploration and insertion process 160 includes the following important sub-processes (i.e., steps):

(i) introduction of a single transistor at the beginning of the NMOS or PMOS network (closest to the output node), or some part thereof; (ii) use of a NMOS and/or a PMOS network in addition to existing NMOS and/or PMOS networks already in the design-specific cell implementation, and (iii) the creation of multi-level NMOS and/or PMOS structures, with possible replication of functionality across such networks. Redundancy exploration and insertion process 160 is invoked to further optimize the performance of the generated design-specific cells.

Figure 7A:
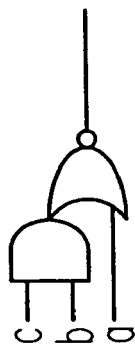
FIGS. 7a, 7b, and 7c are exemplary depictions of an implementation of the present invention having systematic transistor-level redundancy to provide improved timing in a portion of an IC design.
Figure 7C:
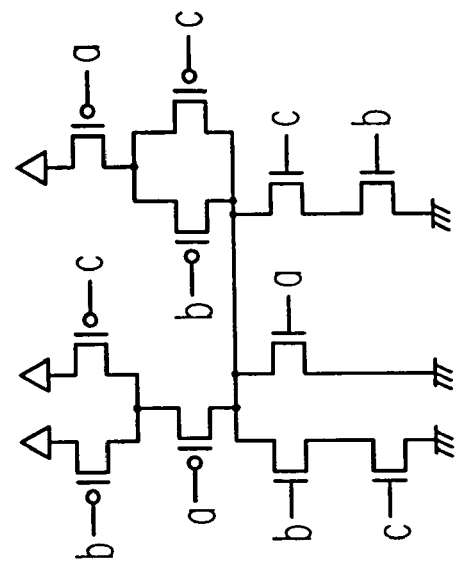
Figure 7B:
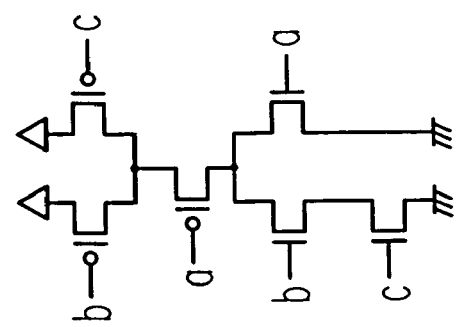

Some exemplary results and uses of the design-specific cell generation process 45 encompassed by the present invention are illustrated in FIGS. 5 through 7. FIG. 5 illustrates a design-specific cell that results when a portion of an IC design is mapped to transistors, with the primary goal being performance optimization. In this case, there is only one critical input, namely input b (300) of the cluster chosen for replacement by the design-specific cell. In this context, critical input denotes an input such that the delay from this input to the output of the cell limits the overall performance of the cell. Optimizing the cluster by using design-specific cells generated in accordance with the present invention, as shown in FIG. 5b, produces the desired optimization results shown in FIG. 5c.

FIG. 6 illustrates a use of a design-specific cell when the primary design objective is transistor-count reduction. As shown in FIGS. 5b and 5c, the number of cells, transistors and wires required in the optimized design-specific cell representation of the IC design is greatly improved.

FIG. 7 shows an illustrative structure that can result from application of the systematic transistor-level redundancy insertion process 160. Redundancy insertion process 160 ensures that the functionality of the resultant structure remains unchanged due to introduction of the new transistors, while meeting target objective(s) in an optimal manner. This process utilizes data about alternative topologies preferably stored in the metrics database as determined by topology alteration process 210.

Note that the impact of a change in transistor topology and transistor sizing on the performance of a design-specific cell is complex. Various combinations of choices made in the above processes, may result in a large set of candidate design-specific cells. Thus, a selection process follows the design-specific cell generation process 45. Preferably, as an initial step, the candidate design-specific cells are rank-ordered using a sophisticated cost function, that evaluates the quality of each candidate design-specific cell, measured using various appropriate target metrics, such as input-to-output delay through the design-specific cell, number of transistors, stack-depth (i.e., length of a path through N- or P-transistors), input load capacitance, output drive strength, etc. A limited number of candidate design-specific cells from the top of the rank-ordered list is then preferably chosen for use in the overall design optimization loop, illustrated in FIG. 2. In a simplified optimization scheme, the design-specific cell selection process can be greedy, or iterative in nature. Other sophisticated design-specific cell selection process search schemes may be chosen to employ other optimization techniques including linear programming, dynamic programming, branch-and-bound search techniques, etc., or some combination thereof, to achieve optimal design of the design-specific cells. The success of the optimization is preferably measured in terms of previously mentioned metrics.

Although the above description is has been described primarily in the context of the static CMOS family of logic circuits, the transistor-level network generation process 100

(including its sub-steps), and the redundancy insertion step 160 are applicable for the NMOS or the PMOS network individually, if the target IC design implementation calls for using another family of MOS circuit design, including but not limited to, various forms of dynamic CMOS, a combination of static and dynamic CMOS, etc.

It should be appreciated that the layout synthesis process 110 and post-layout characterization process 140 of design-specific cell generation process 45 depicted in FIG. 3, can be performed separately, or coupled in an iterative manner with other aspects of design-specific cell generation process 45, in order to create a highly optimized layout of the transistor-level netlist derived from the generation process 100.

In layout synthesis step 110, the transistor-level netlist is translated to a layout for use by a target IC fabrication process. The present invention observes the constraints imposed on the layout synthesis by the intended IC fabrication process technology. The layout synthesis step 110 preferably uses automated layout synthesis techniques and tools. Layout synthesis 110 is preferably further augmented with transistor sizing, that is distinct from transistor sizing step 130 since post-layout estimation of parasitics is much more accurate than pre-layout estimation. In this manner, the transistors can be fine-tuned in the final layout.

Post-layout characterization step 140 operates closely with layout synthesis 110. It is preferable that characterization step 140 employ a highly accurate device-level simulator such as SPICE or variations thereof. It is possible that other tools, including macro-modeling tools with sufficient accuracy, and new characterization tools and processes developed for this invention, will be used for the pre-layout characterization step 120. The inputs to the post-layout characterization step 140 are (i) layouts generated in the layout synthesis step 110, (ii) models of the devices used in the layout, and (iii) importantly, the context of use for each design-specific cell in the specific design for which the design-specific cell is created. The results of characterization step 140 can be used to drive the layout synthesis step 110, with altered constraints, and the steps 160, 110, and 140 can be repeated until, for example, the target timing characteristics of the design-specific cell(s) being designed and evaluated, are satisfied.

It should be understood that the foregoing description is only illustrative of the invention. Various alternatives and modifications can be devised, without departing from the invention. For example, the methods of the present invention can be implemented by an automated computer system programmed to control the execution of these teachings. Accordingly, the present invention is intended to embrace all such alternatives, modifications and variances that fall within the scope of the appended claims.

What is claimed is:

1. An automated method for designing an integrated circuit (IC) design-specific cell, said method comprising the steps of:
   receiving a design specification for electrical behavior or transistor-level characteristics of said design-specific cell;
   mapping said design specification to a transistor-level representation of said design-specific cell;
   evaluating said transistor-level representation of said design-specific cell for meeting said design specification; and
   altering said transistor-level representation of said design-specific cell to meet said design specification.

2. The method of claim 1, wherein said step of evaluating comprises evaluating said transistor-level representation of said design-specific cell based on a specific design context in which said design-specific cell is to be used.

3. The method of claim 1, wherein said step of receiving comprises receiving a description of said design-specific cell.

4. The method of claim 3, wherein said description is selected from a group consisting of a netlist representation, a descriptive language representation, and a standard-cell representation of said design-specific cell, wherein said standard-cell is used in an IC design process.

5. The method of claim 1, wherein said design specification is selected from the group consisting of: size (area), signal timing, transistor sizing, number of transistors, power consumption, length of interconnects within said design-specific cell, output signal strength, input signal impedance, noise characteristics, and a combination thereof.

6. The method of claim 1, wherein said step of mapping comprises:
   generating a transistor netlist based on at least one netlist generation algorithm; and
   evaluating said generated transistor netlist based on at least one design specification.

7. The method of claim 6, wherein said step of mapping further comprises optimizing transistor size for said generated transistor netlist.

8. The method of claim 1, wherein said step of mapping is based on at least one of a plurality of topology formats.

9. The method of claim 1, wherein said method further comprises the step of creating at least one transistor-level redundancy for aiding in satisfying said design specification.

10. The method of claim 1, wherein said method further comprises the step of detecting an implementation weakness in a cell for implementing said IC.

11. The method of claim 1, wherein said design specification comprises electrical behavior and transistor-level characteristics of said design-specific cell.

12. The method of claim 1, wherein said integrated circuit design-specific cell is selected from the group consisting of: CMOS cells, static CMOS cells, dynamic CMOS cells and combinations thereof.

13. A system for automatically designing an integrated circuit (IC) design-specific cell, said system comprising:
   an interface for receiving a design specification for electrical behavior or transistor-level characteristics of said design-specific cell;
   a mapping process that maps said design specification to a transistor-level representation of said design-specific cell;
   an evaluating process that evaluates said transistor-level representation of said design-specific cell for determining whether said transistor-level representation of said IC meets said design specification; and
   an alteration process that alters said transistor-level representation of said design-specific cell to meet said design specification.

14. The system of claim 13, wherein said evaluating process evaluates said transistor-level representation of said design-specific cell based on a specific design context in which said design-specific cell is to be used.

15. The system of claim 13, wherein said interface receives a description of said design-specific cell.

16. The system of claim 15, wherein said description received by said interface is selected from a group consisting of: a netlist representation, a descriptive language representation, and a standard-cell representation of said design-specific cell, wherein said standard-cell is used in an IC design process.

17. The system of claim 13, wherein said mapping process controls the mapping of said transistor-level representation on the basis of said design specification selected from the group consisting of: size (area), signal timing, transistor sizing, number of transistors, power consumption, fault tolerance, integrity characteristics, noise characteristics, and a combination thereof.

18. The system of claim 13, wherein said mapping process generates a transistor netlist based on at least one netlist generation algorithm; and evaluates said generated transistor netlist based on at least one design specification.

19. The system of claim 13, wherein said mapping process further comprises a controller that controls the mapping using a plurality of topology formats.

20. The system of claim 13, wherein said mapping process further comprises a controller for optimization of transistor sizing for said generated transistor netlist.

21. The system of claim 13, wherein said system further comprises a process that creates at least one transistor-level redundancy for said IC cell for aiding in meeting said design specification.

22. The system of claim 13, wherein said system further comprises a detector that detects an implementation weakness in a cell for implementing said IC.

23. The system of claim 13, wherein said design specification comprises electrical behavior and transistor-level characteristics of said design-specific cell.

24. The system of claim 13, wherein said integrated circuit design-specific cell is selected from the group consisting of: CMOS cells, static CMOS cells, dynamic CMOS cells and combinations thereof.

25. A design-specific cell produced by an automated integrated circuit (IC) design process, said IC design process comprises the steps of:
receiving a design specification for electrical behavior or transistor-level characteristics of said design-specific cell;
mapping said design specification to a transistor-level representation of said design-specific cell,
evaluating said transistor-level representation of said design-specific cell for meeting of said design specification; and
altering said transistor-level representation of said design-specific cell to meet said design specification.

26. The design-specific cell produced by the IC design process of claim 25, wherein said step of evaluating comprises evaluating said transistor-level representation of said design-specific cell based on a specific design context in which said design-specific cell is to be used.

27. The design-specific cell produced by the IC design process of claim 25, wherein said step of receiving comprises receiving a description of said design-specific cell.

28. The design-specific cell produced by the IC design process of claim 27, wherein said description is selected from a group consisting of: a netlist representation, a descriptive language representation, and a standard-cell representation of said design-specific cell, wherein said standard-cell is used in an IC design process.

29. The design-specific cell produced by the IC design process of claim 25, wherein said design specification is selected from the group consisting of: size (area), signal timing, transistor sizing, number of transistors, power consumption, length of interconnects within said design-specific cell, output signal strength, input signal impedance, noise characteristics, and a combination thereof.

30. The design-specific cell produced by the IC design process of claim 25, wherein said step of mapping comprises:
generating a transistor netlist based on at least one netlist generation algorithm; and
evaluating said generated transistor netlist based on at least one design specification.

31. The design-specific cell produced by the IC design process of claim 30, wherein said step of mapping further comprises optimizing the transistor size for said generated transistor netlist.

32. The design-specific cell produced by the IC design process of claim 25, wherein said step of mapping is based on at least one plurality of topology format.

33. The design-specific cell produced by the IC design process of claim 25, wherein said method further comprises the step of creating at least one transistor-level redundancy for aiding in meeting said design specification.

34. The design-specific cell produced by an automated integrated circuit (IC) design process of claim 25, wherein said design specification comprises electrical behavior and transistor-level characteristics of said design-specific cell.

35. The design-specific cell of claim 25, wherein the integrated circuit design-specific cell is selected from the group consisting of: CMOS cells, static CMOS cells, dynamic CMOS cells and combinations thereof.

36. A storage medium having computer readable program instructions embodied therein for automatically designing an integrated circuit (IC) design-specific cell, said storage medium comprising:
program instructions for receiving a design specification for electrical behavior or transistor-level characteristics of said design-specific cell;
program instructions for mapping said design specification to a transistor-level representation of said design-specific cell;
program instructions for evaluating said transistor-level representation of said design-specific cell for satisfaction of said design specification; and
program instructions for altering said transistor-level representation of said design-specific cell to meet said design specification.

37. The storage medium of claim 36, wherein said design specification comprises electrical behavior and transistor-level characteristics of said design-specific cell.

38. The storage medium of claim 36, wherein said integrated circuit design-specific cell is selected from the group consisting of: CMOS cells, static CMOS cells, dynamic CMOS cells and combinations thereof.

* * * * *